US007737020B1

(12) United States Patent
Ho et al.

(10) Patent No.: US 7,737,020 B1
(45) Date of Patent: Jun. 15, 2010

(54) METHOD OF FABRICATING CMOS DEVICES USING FLUID-BASED DIELECTRIC MATERIALS

(75) Inventors: Jonathan Jung-Ching Ho, Fremont, CA (US); Hong-Tsz Pan, Cupertino, CA (US)

(73) Assignee: XILINX, Inc., San Jose, CA (US)

( * ) Notice: Subject to any disclaimer, the term of this patent is extended or adjusted under 35 U.S.C. 154(b) by 271 days.

(21) Appl. No.: 11/313,521

(22) Filed: Dec. 21, 2005

(51) Int. Cl.
*H01L 21/4763* (2006.01)
(52) U.S. Cl. .............. 438/619; 257/522; 257/E21.573
(58) Field of Classification Search ............ 438/619; 257/522
See application file for complete search history.

(56) References Cited

U.S. PATENT DOCUMENTS

| 6,413,852 | B1 * | 7/2002 | Grill et al. .............. 438/619 |
| 6,413,854 | B1 * | 7/2002 | Uzoh et al. ............ 438/637 |
| 6,534,868 | B2 * | 3/2003 | Sekiguchi ............... 257/758 |
| 6,984,892 | B2 * | 1/2006 | Gotkis et al. ........... 257/758 |
| 2003/0209805 | A1 * | 11/2003 | Choi et al. .............. 257/758 |
| 2003/0219968 | A1 * | 11/2003 | Adem et al. ............. 438/622 |
| 2005/0067701 | A1 * | 3/2005 | Coolbaugh et al. ...... 257/751 |
| 2005/0215047 | A1 * | 9/2005 | Daamen et al. .......... 438/619 |
| 2005/0230836 | A1 * | 10/2005 | Clarke et al. ............ 257/760 |

\* cited by examiner

*Primary Examiner*—Walter L Lindsay, Jr.
*Assistant Examiner*—Reema Patel
(74) *Attorney, Agent, or Firm*—Scott Hewett; Thomas George

(57) ABSTRACT

Fluid-based dielectric material is used to backfill multiple patterned metal layers of an IC on a wafer. The patterned metal layers are fabricated using conventional CMOS techniques, and are IMD layers in particular embodiments. The dielectric material(s) are etched out of the IC to form a metal network, and fluid dielectric material precursor, such as a polyarylene ether-based resin, is applied to the wafer to backfill the metal network with low-k fluid-based dielectric material.

10 Claims, 4 Drawing Sheets

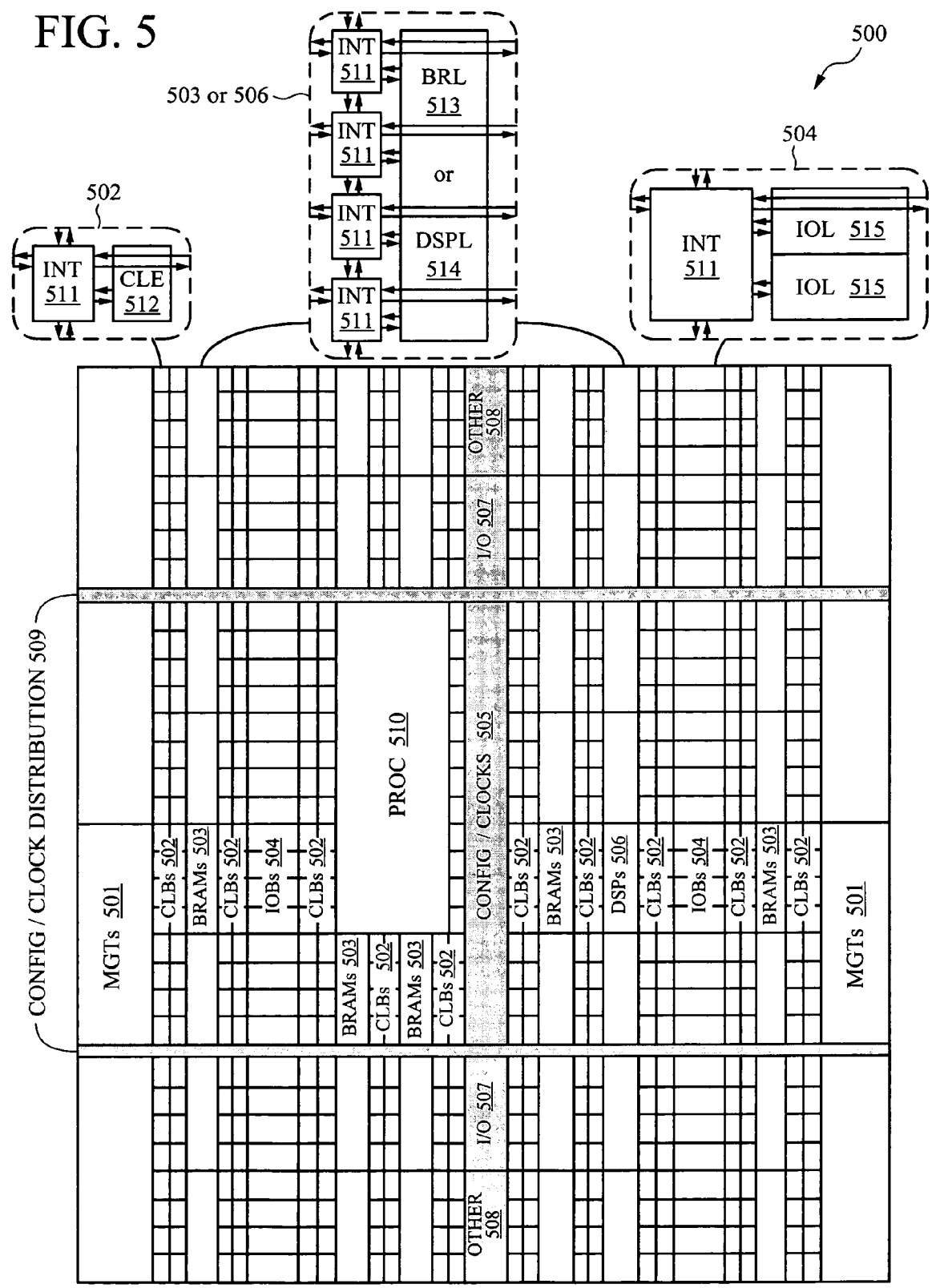

METHOD OF FABRICATING CMOS DEVICES USING FLUID-BASED DIELECTRIC MATERIALS

FIELD OF THE INVENTION

This invention relates generally to techniques for fabricating integrated circuits, and more particularly to forming dielectric layers using fluid precursors.

BACKGROUND OF THE INVENTION

Integrated circuits ("ICs") typically have several patterned thin-film metal layers separated by dielectric layers. Conductive vias are used to make electrical connections from one patterned metal layer to another. It is desirable to avoid parasitic capacitances for a variety of reasons, and "low-k" dielectric materials (i.e. materials having a low dielectric constant) are preferred. As used herein, "low-k" refers to dielectric material that has a relative dielectric constant less than 4, which is the nominal relative dielectric constant of silica.

Several types of low-k dielectric materials are based on silica, such as fluorinated silicate glasses ("FSGs") or undoped silicate glasses ("USGs"). Many IC fabrication techniques have been developed to use FSG materials, such as chemical-mechanical polishing ("CMP"), via etch processes, and metallization processes. Other types of low-k dielectric materials are organic-based.

An example of an organic-based low-k dielectric material is the dielectric material resulting after processing SiLK™ resin. SiLK™ resin is available from the ADVANCED ELECTRONIC MATERIALS group of THE DOW CHEMICAL COMPANY, and is applied as in a fluid state. After the resin is cured, a porous dielectric matrix remains. Dielectric materials having relative dielectric constants as low as 2.6, and in some instances as low as 2.2, are obtained using SiLK™ material. For purposes of discussion, low-k dielectric materials that are applied to an IC wafer in a fluid state and then cured to provide solid dielectric material incorporated in the IC will be referred to as "fluid-based" dielectric materials.

While SiLK™-type materials have been developed to utilize typical IC fabrication apparatus and methods, the techniques for using organic-based low-k dielectric materials in ICs are often substantially different than those for using FSG or USG materials. For example, SiLK™ layers can be patterned. They are often cured for a relatively long time (24 hours) after patterning, which is not required with FSG or USG materials. If SiLK resin is used to form many layers of dielectric material in the IC, the after-patterning cure is typically repeated for each layer, adding to the process time, increasing work-in-progress, and often reducing throughput of the IC fabrication facility.

It is therefore desirable to provide techniques for utilizing fluid-based dielectric materials between conductive layers in an IC that avoids the multiple curing times of conventional techniques.

SUMMARY OF THE INVENTION

Fluid-based dielectric material is used to backfill multiple patterned metal layers in an IC. The patterned metal layers are fabricated using conventional CMOS techniques, and are IMD layers in particular embodiments. Sacrificial material(s) are etched out of the IMD layers to form a metal network, and fluid dielectric material precursor, such as a polyarylene ether-based resin, is applied to the wafer to backfill the metal network with low-k fluid-based dielectric material.

BRIEF DESCRIPTION OF THE DRAWINGS

FIG. 5 is a plan view of a field-programmable gate array fabricated according to an embodiment of the invention.

DETAILED DESCRIPTION OF THE DRAWINGS

Figure 1:
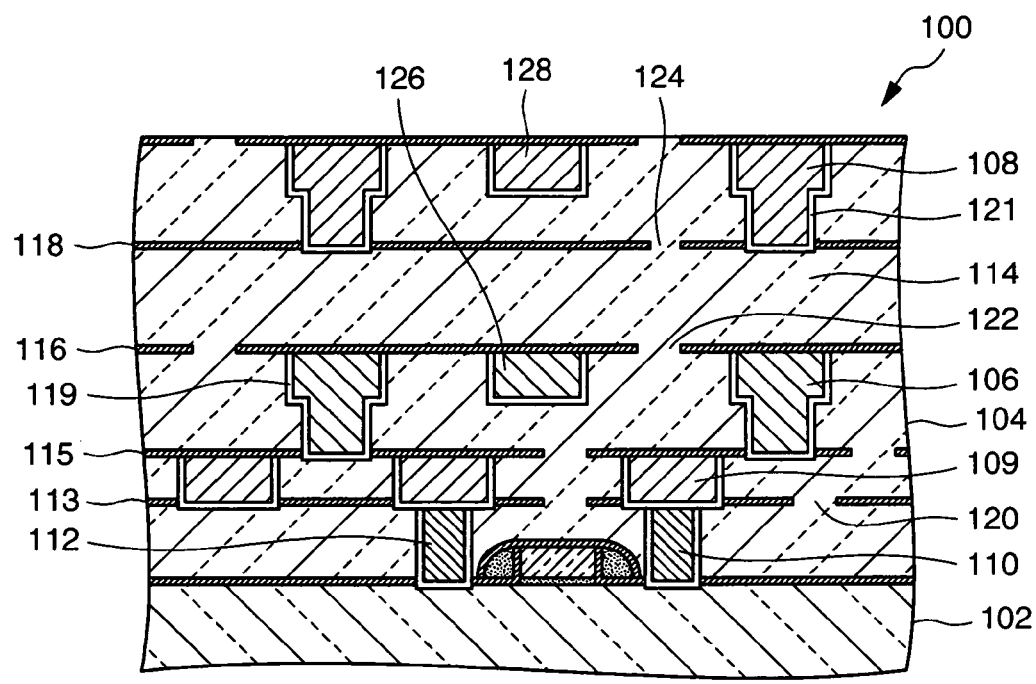
FIG. 1 is a cross section of a portion of a CMOS IC according to an embodiment of the invention.

The fabrication of an IC is often described in terms of the "frontend" processes and the "backend" processes. The frontend processes generally relate to forming the semiconductor devices, such as transistors, resistors, diodes, and capacitors, in the semiconductor wafer. The backend processes generally relate to the overlying patterned metal layers and dielectric layers, including via formation and conductive trench formation used in a single damascene or dual damascene process, for example.

The frontend processes are familiar to those skilled in the art of CMOS fabrication techniques, and hence will only be briefly described. Examples of frontend processes include shallow trench isolation, well implantation, gate oxide formation, poly gate formation, light-doped drain ("LDD") or HDD, and HALO implantation, gate sidewall spacer formation, source/drain implantation, and silicidation.

In an exemplary conventional backend process flow using fluid-based dielectric material (e.g. SiLK™-based), a conventional dielectric layer is used for the inter-layer dielectric ("ILD"). SiLK™ resin is used to form inter-metal dielectric ("IMD") layers. A typical process includes applying the resin, partially curing the resin for photolithography, defining vias and trenches in the partially cured resin, depositing a conductive liner layer, copper plating the lined trenches and vias, performing CMP on the plated copper, and curing of the resin to form a fluid-based dielectric material. This sequence is repeated for successive IMD layers. After the IMD processing, an aluminum re-distribution layer with pad openings is typically formed, and a polyimide layer is formed over the re-distribution layer to environmentally protect the IC and avoid shorting of the re-distribution layer.

In a complex IC, such as a field-programmable gate array or other CMOS IC, there are several layers of patterned trenches and vias (i.e. several metal interconnect layers), typically at least five patterned metal layers. For example, a VIRTEX-4™FPGA, available from XILINX, INC., of San Jose, Calif., has eleven metal interconnect layers. Assuming a twenty-four hour cure period if SiLK™ resin were used for each of the layers, the backend processing alone would take over eleven days.

Embodiments of the invention allow using fluid-based low-k dielectric materials for several IMD layers with only a single cure period. This is achieved by using conventional silicate glass materials, such as FSG or USG, or even specialized sacrificial materials, which may or may not be dielectric materials, to form the patterned metal interconnect layers (i.e.

the filled vias and trenches), removing the sacrificial material, and backfilling the resulting void with fluid-based low-k dielectric material. This allows very low-k dielectric material to be formed between several (more than two) metal interconnect layers, yet only needs a single application of low-k precursor fluid and a single cure period. Also noteworthy is that the processing of the low-k precursor is simplified because all the patterning of the metalized via and trenches has been done prior to application of the fluid. This avoids needing to partially cure the resin prior to pattering, and then manipulating the IC wafer with the relatively fragile partially cured resin.

FIG. 1 is a cross section of a portion of a CMOS IC 100 according to an embodiment of the invention. The IC 100 includes a semiconductor wafer portion 102 and backfilled portion 104. The backfilled portion has multiple patterned metal layers 106, 108, 109 (only three of which are shown, but typically many more patterned metal layers are present), metal contacts 110, 112 to the semiconductor wafer portion, and a fluid-based dielectric material 114 between and about the patterned metal layers and contacts. In a particular embodiment, the fluid-based dielectric material is a porous silica material having a relative dielectric constant less than 2.6. In an alternative embodiment the fluid-based dielectric material is a low-k dielectric material having a relative dielectric constant less than 4.0.

The patterned metal layers 106, 108 have been formed using a dual damascene technique and the patterned metal layer 109 has been formed using a single damascene technique, which are well-known in the art of CMOS IC fabrication. Other techniques of metal patterning in ICs, such as metal film deposition and etch techniques, are alternatively used. The material from which the metal vias and trenches in the backfilled portion 104 has been removed and replaced with a unitary layer of fluid-based dielectric material 114, which provides a very low dielectric constant, improving speed and reducing loss in the finished device.

The IC includes etch stop layers 113, 115, 116, 118, which in a particular embodiment are silicon nitride layers, and barrier layers 119, 121 that form a diffusion barrier to the copper used to fill the trenches and vias. In a particular embodiment, the barrier layers are tantalum and tantalum nitride layers. Access holes 120, 122, 124 formed in the etch stop layers allow etchant to remove sacrificial material (see FIG. 2A, ref. nums. 230, 232) below the etch stop layers, and allow subsequent access for fluid dielectric material precursor to fill the regions of removed sacrificial material.

"Dummy metal" 126, 128 on remaining portions of the etch stop layers are desirable for CMP processing of the metal layers, as discussed below in reference to FIG. 2B. Dummy metal pads are known in the art of IC fabrication as being metal areas added to a patterned metal layer to facilitate uniform CMP processing. For example, dummy metal pads are added to regions having relatively few traces so that these regions are processed similarly (e.g. at the same material removal rate) as regions that have many traces. Providing access holes through the etch stop layers, while leaving remaining portions of the etch stop layers to support the dummy metal pads, keeps the dummy metal pads from floating away during sacrificial material etching or backfill processes.

Figure 2A:
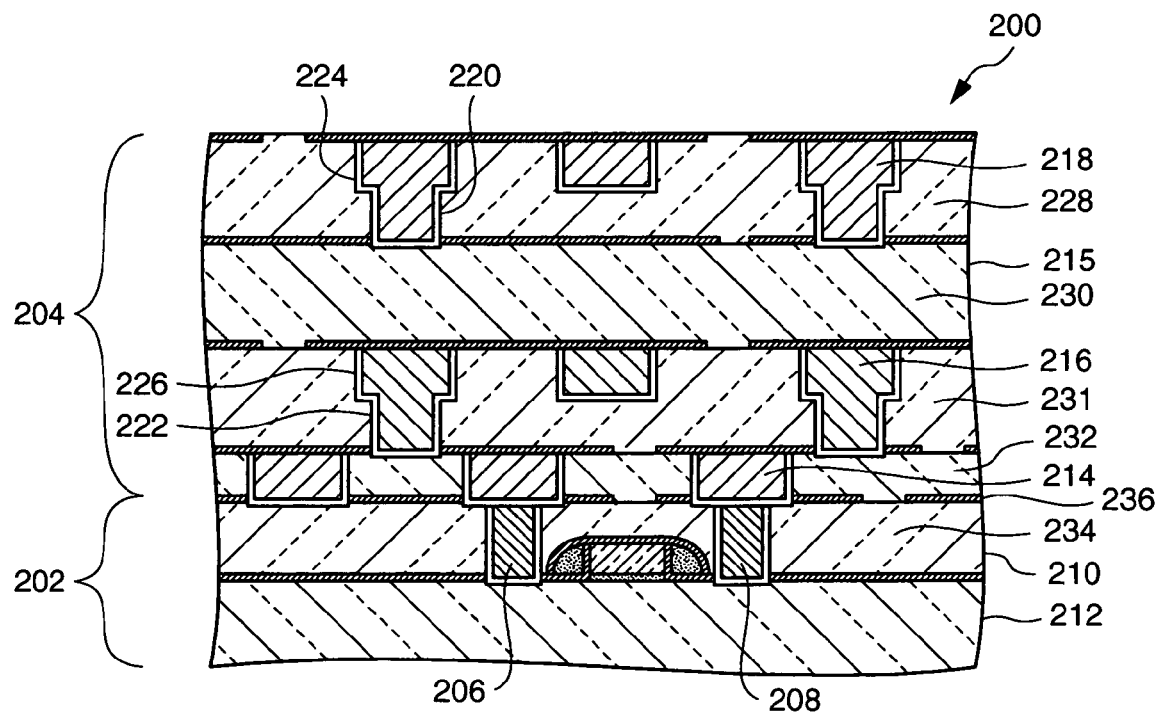
FIG. 2A is a cross section of a portion of a partially fabricated CMOS device 200 according to an embodiment of the invention.

FIG. 2A is a cross section of a portion of a partially fabricated CMOS device 200 according to an embodiment of the invention. The partially fabricated CMOS device 200 has a frontend portion 202 and a backend portion 204. The frontend portion 202 includes source/drain contacts 206, 208 extending through an ILD layer 210 formed over the semiconductor substrate 212. The source/drain contacts 206, 208 electrically couple the source and drain of a field-effect transistor to patterned metal layers 214, 216, 218 in the backend portion 204. In a conventional IC, the patterned metal layers in the backend portion are fabricated in a dielectric material, such as USG or FSG, and are commonly referred to as "IMD layers." Those of skill in the art of CMOS ICs appreciate that the source and drain contacts are not necessarily connected to each of the patterned metal layers, and that the patterned metal layers in the backend portion are typically coupled to many different devices and many different terminals of the CMOS IC.

The cross section of FIG. 2A shows metalized vias 220, 222 and metalized trenches 224, 226 in two of the IMD layers 214, 218. An IMD layer 215 also has metalized vias and trenches that are not sectioned in this view. A typical CMOS IC often has more than four IMD layers (i.e. more than three patterned metal layers), and some complex CMOS ICs, such as some FPGAs, have eleven or more IMD layers. The metalized trench 224 and via 220 of the top patterned metal layer 218 are within sacrificial material 228. The other patterned metal layers 214, 215, 216 similarly have sacrificial material 230, 231, 232. This sacrificial material 228, 230, 232 will be removed by etching and replaced with fluid-based dielectric material that provides a lower dielectric constant than the sacrificial material.

In a particular embodiment, all IMD layers use essentially the same sacrificial material, such as FSG or USG. Alternatively, different IMD layers use different sacrificial materials. The sacrificial material is chosen to provide good trench/via formation and also so that it may be removed without substantially removing the metal of vias or trenches. Dielectric material used in conventional CMOS ICs is incorporated into the final device, and is formed to have a low dielectric constant. The sacrificial material of the present has no such constraint, since it will be removed and not incorporated into the final device. This allows optimizing the sacrificial material for manufacturability of the patterned metal layers and etch removal.

In a particular embodiment, the dielectric material 234 of the ILD layer 210 is also removed and hence is also sacrificial material in such embodiments. This can be done by selecting the dielectric material 234 of the ILD layer 210 to be etched using the same process used to remove the sacrificial material (s) of the IMD layers, or by using different etch processes to remove the sacrificial material and to remove the dielectric material 234 of the ILD layer 210. In a particular embodiment, the sacrificial material(s) and dielectric material 234 of the ILD layer 210 are all silicate-based, and are all removed using buffered hydrofluoric acid. Alternatively, the dielectric material 234 of the ILD layer 210 is not removed and replaced (see FIG. 3). For example, access holes are not formed through the etch stop layer 236 between the ILD layer 210 and the sacrificial material 232 of the first patterned metal layer 214.

Figure 2B:
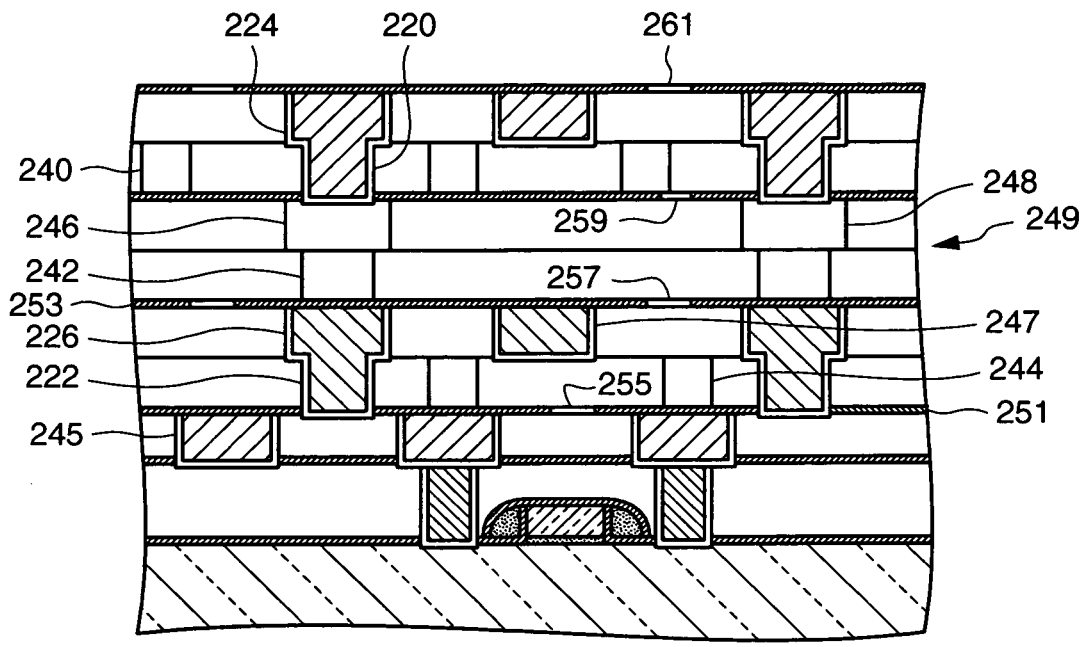
FIG. 2B is a cross section of the partially fabricated CMOS device of FIG. 2A after removal of the sacrificial materials.

FIG. 2B is a simplified cross section of the partially fabricated IC of FIG. 2A after removal of the sacrificial materials and ILD (see FIG. 2A, ref. nums. 228, 230, 232, 234). The vias 220, 222 and trenches 224, 226 are supported by the network of metal structures in the IC after the sacrificial materials have been removed so as to form a metal network 249. Removal of the sacrificial materials also shows metal vias 240, 242, 244 and trenches 246, 248 that were not sectioned in FIG. 2A. A trench is often supported in many places by a number of vias. Dummy metal pads 245, 247 are supported by the etch stop layers 251, 253. Access holes 255, 257, 259, 261 (many others of which are not shown) provided entry for etchant to remove the sacrificial material and ILD, and will provide a path for fluid dielectric material precursor. Generally, each via connects a trench in one IMD to another trench in another IMD. In many cases, vias extend through several IMD layers, in other words, the interconnected metal structures do not need to lie in adjacent patterned metal layers.

Figure 2C:
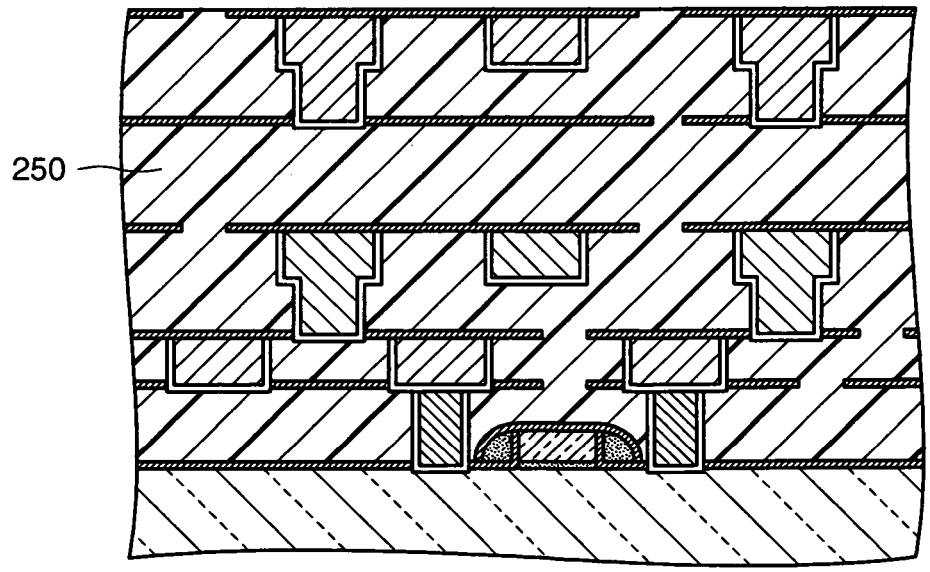
FIG. 2C is a cross section of the partially fabricated CMOS IC of FIG. 2B after backfilling with fluid-based dielectric material.

FIG. 2C is a cross section of the partially fabricated IC of FIG. 2B after backfilling with fluid dielectric material precursor 250. In a particular embodiment, the fluid dielectric material precursor 250 includes silica particles suspended in an organic carrier. The fluid dielectric material precursor 250 is applied to the IC wafer in a spin-on, dip, or other coating process, or in multiple application steps. In a particular embodiment, a polyarylene ether (e.g. SiLK™ resin, available from THE DOW CHEMICAL COMPANY, or FLARE™ resin, available from HONEYWELL) precursor is spun-on and cured according to the manufacture's recommendations to provide a fluid-based dielectric material (see FIG. 1, ref. num. 114). Alternatively, other polyarylenes, benzocyclobutene-based resins polyimide resins or other organic-type or inorganic-type (i.e. those that contain significant amounts of silicon forming the backbone of the resultant molecular structure) of fluid dielectric material precursor are used.

The fluid dielectric material precursor 250 permeates metal network (see FIG. 2B, ref. num. 249) formed by the multiple patterned metal layers left after the sacrificial material has been removed. In other words, the resulting fluid-based dielectric material surrounds the lower patterned metal layers and partially surrounds, except for perhaps the top surface, the top metal layer 218, as a unitary layer of fluid-based dielectric material precursor. This avoids the multiple application, curing, and other steps used in conventional IC fabrication where separate fluid-based dielectric material layers are used in each IMD layer. In other words, the fluid-based dielectric material is contiguous across two or more patterned metal layers.

Other distinctions arise because, unlike conventional use of fluid dielectric material precursors, the fluid-based dielectric material of embodiments does not need to be patterned. When fluid dielectric material precursor is applied and processed layer-by-layer, bubble defects (voids) form that adversely affect layer processing. For example, a void in the fluid-based dielectric material may trap impurities, or cause non-uniformities in an etch process, or a truncated void can cause an uneven surface for a subsequent deposition process, or a void might be filled with metal material that alters performance of the IC, and might even short metal lines together. Bubble defects do not substantially effect the backfilling process because the metal patterning was done using the sacrificial material. Bubble defects in the backfilled fluid-based dielectric material merely create a small volume of gas (e.g. air) that typically has a slightly lower dielectric constant than the fluid-based dielectric material.

Backfilling with fluid dielectric material precursor also simplifies processing because a pre-cure of the fluid precursor prior to photolithography is not necessary. Similarly, greater tolerances in spin-on thickness and thickness uniformity is tolerable because the as-spun surface is not critical. After curing, it may be planarized (e.g. by CMP) and then further processed.

Figure 3:
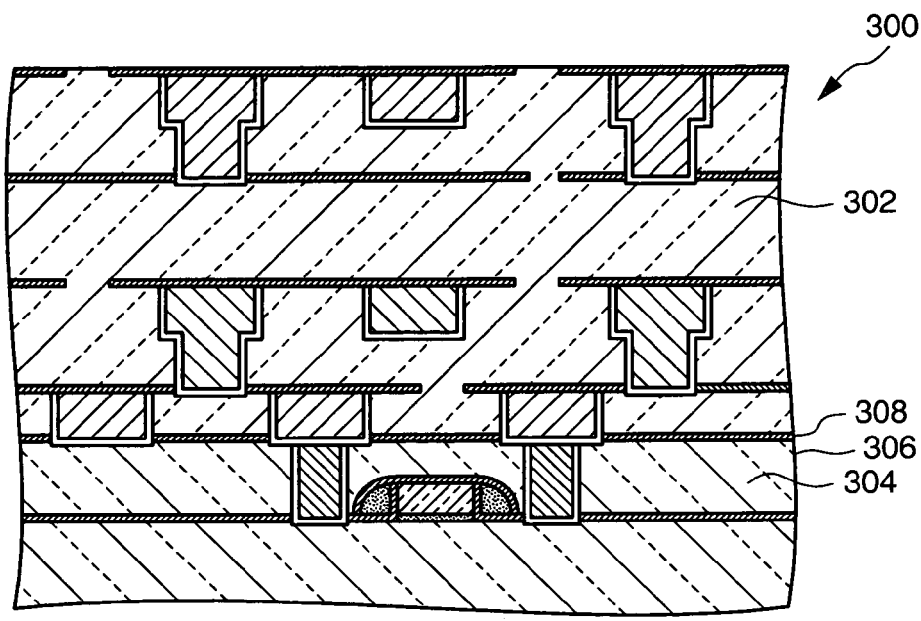
FIG. 3 is a cross section of a portion of an IC according to another embodiment of the invention.

FIG. 3 is a cross section of a portion of an IC 300 according to another embodiment of the invention. Fluid-based dielectric material 302 has replaced the sacrificial materials in the IMD layers (see FIG. 2A, ref. nums. 228, 230, 231, 232), but has not replaced the original dielectric material 304 in the ILD layer 306 (compare FIG. 2A, ref. num. 234 and FIG. 1). An intact etch stop layer 308 (i.e. one without access holes, compare FIG. 1, ref. num. 120) above the ILD layer 306 protects the dielectric material of the ILD layer when the sacrificial material is removed from the overlying patterned metal layers.

Figure 4:
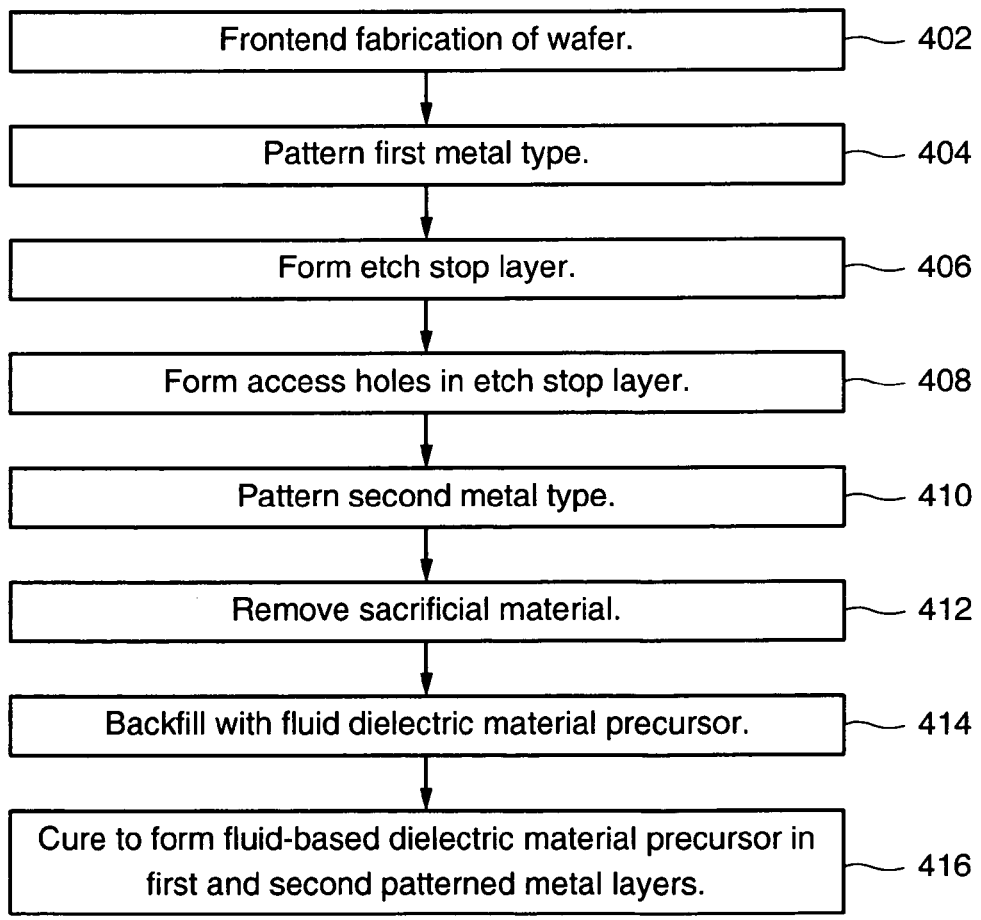
FIG. 4 a flow chart of a method of fabricating an IC according to an embodiment of the invention.

FIG. 4 is a flow chart of a method of fabricating an IC 400 according to an embodiment of the invention. A partially fabricated wafer is provided (step 402). In a particular embodiment, the wafer is processed through the frontend portion of the IC fabrication sequence. A first patterned metal layer with first sacrificial material is formed on the wafer (step 404). In a particular embodiment, the first patterned metal layer is a single-damascene layer. In a particular embodiment, an etch stop layer is formed over the patterned metal layer (step 406) and access holes are formed in the etch stop layer (step 408) to provide subsequent entry for etchant and fluid dielectric material precursor. Alternatively, the first patterned metal layer is defined from a thin-film metal layer(s) on a first sacrificial layer, and then sacrificial material is formed over the patterned thin-film metal layer.

A second patterned metal layer, which in a particular embodiment is a dual-damascene layer, with second sacrificial material is formed on the wafer (step 410). In a particular embodiment the first sacrificial material is substantially the same as the second sacrificial material. Alternatively, the first sacrificial material is different from the second sacrificial material. In a particular embodiment, the first and second sacrificial materials are both silicate materials. In further embodiment, additional patterned metal layers with sacrificial material(s) are formed on the substrate, typically with intervening etch stop layers having access holes.

Then, after the first and second patterned metal layers have been formed, the first and second sacrificial materials are removed (step 412) so as to form a metal network. Fluid dielectric material precursor is applied to the wafer so as to permeate the metal network (step 414), and the fluid dielectric material precursor is cured (step 416) to form fluid-based dielectric material in the first and second patterned metal layers. The wafer is then processed into ICs.

In some embodiments, a first sequence of IMD layers (e.g. the first five IMD layers) are formed, sacrificial material from the first IMD layers is removed, and the first sequence of IMD layers is backfilled with fluid dielectric material precursor. Then, a second sequence of IMD layers (e.g. the next five IMD layers) are formed, sacrificial material is removed, and the second sequence of IMD layers is backfilled with the same or a different fluid dielectric material precursor. An IC backfilled with SiLK™ material and cured was strong enough for conventional CMP processing of the final layer.

FIG. 5 is a plan view of a field-programmable gate array fabricated according to an embodiment of the invention. The FPGA is an integrated circuit that includes CMOS portions in several of the functional blocks, such as in RAM and logic, and is fabricated using a CMOS fabrication process. The FPGA has several patterned metal layers, and using individually cured IMD layers would add several hours, or even days, of processing time to a typical FPGA. In a particular embodiment, at least some of the IMD layers have been backfilled with fluid-based low-k dielectric material. In other embodiments, all IMD layers have been backfilled with one or more fluid-based dielectric material(s). In a further embodiment, the IMD layer has also been backfilled with fluid-based dielectric material.

Providing multiple IMD layers backfilled with a single application of fluid-based dielectric material greatly reduces the processing time compared to individually applying and curing each layer. Low-k fluid-based dielectric materials provide dielectric constants significantly lower than those obtained with silicate-based glasses, which increases the speed, reduces signal losses, and reduces power consumption of the IC.

The FPGA architecture includes a large number of different programmable tiles including multi-gigabit transceivers (MGTs 501), configurable logic blocks (CLBs 502), random access memory blocks (BRAMs 503), input/output blocks (IOBs 504), configuration and clocking logic (CONFIG/CLOCKS 505), digital signal processing blocks (DSPs 506), specialized input/output blocks (I/O 507) (e.g., configuration ports and clock ports), and other programmable logic 508 such as digital clock managers, analog-to-digital converters, system monitoring logic, and so forth. Some FPGAs also include dedicated processor blocks (PROC 510).

In some FPGAs, each programmable tile includes a programmable interconnect element (INT 511) having standardized connections to and from a corresponding interconnect element in each adjacent tile. Therefore, the programmable interconnect elements taken together implement the programmable interconnect structure for the illustrated FPGA. The programmable interconnect element (INT 511) also includes the connections to and from the programmable logic element within the same tile, as shown by the examples included at the top of FIG. 5.

For example, a CLB 502 can include a configurable logic element (CLE 512) that can be programmed to implement user logic plus a single programmable interconnect element (INT 511). A BRAM 503 can include a BRAM logic element (BRL 513) in addition to one or more programmable interconnect elements. Typically, the number of interconnect elements included in a tile depends on the height of the tile. In the pictured embodiment, a BRAM tile has the same height as four CLBs, but other numbers (e.g., five) can also be used. A DSP tile 506 can include a DSP logic element (DSPL 514) in addition to an appropriate number of programmable interconnect elements. An IOB 504 can include, for example, two instances of an input/output logic element (IOL 515) in addition to one instance of the programmable interconnect element (INT 511). As will be clear to those of skill in the art, the actual I/O pads connected, for example, to the I/O logic element 515 are manufactured using metal layered above the various illustrated logic blocks, and typically are not confined to the area of the input/output logic element 515. In the pictured embodiment, a columnar area near the center of the die (shown shaded in FIG. 5) is used for configuration, clock, and other control logic.

Some FPGAs utilizing the architecture illustrated in FIG. 5 include additional logic blocks that disrupt the regular columnar structure making up a large part of the FPGA. The additional logic blocks can be programmable blocks and/or dedicated logic. For example, the processor block PROC 510 shown in FIG. 5 spans several columns of CLBs and BRAMs.

Note that FIG. 5 is intended to illustrate only an exemplary FPGA architecture. The numbers of logic blocks in a column, the relative widths of the columns, the number and order of columns, the types of logic blocks included in the columns, the relative sizes of the logic blocks, and the interconnect/logic implementations included at the top of FIG. 5 are purely exemplary. For example, in an actual FPGA more than one adjacent column of CLBs is typically included wherever the CLBs appear, to facilitate the efficient implementation of user logic.

While the present invention has been described in connection with specific embodiments, variations of these embodiments will be obvious to those of ordinary skill in the art. For example, other materials may be used for the fluid dielectric material precursor(s) and/or sacrificial material(s), or other fabrication sequences may be followed. Therefore, the spirit and scope of the appended claims should not be limited to the foregoing description.

What is claimed is:

1. A method of fabricating an integrated circuit ("IC") comprising:
   providing a partially fabricated wafer;
   forming a first patterned metal layer with a first sacrificial material;
   forming an etch stop layer planar in shape and entirely atop the first patterned metal layer, with an entirety of the etch stop layer being parallel to the wafer;
   forming access holes in the etch stop layer directly above at least one portion of the first sacrificial material leaving at least a portion of the etch stop layer atop at least another portion of the first sacrificial layer; and then
   forming a second patterned metal layer with a second sacrificial material atop the etch stop layer;
   removing the first sacrificial material and the second sacrificial material so as to form a metal network without removing any portion of the etch stop layer;
   applying fluid dielectric material precursor to the partially fabricated wafer, the fluid dielectric material flowing through the access holes of the etch stop layer so as permeate the metal network; and
   curing the fluid dielectric material precursor to form fluid-based dielectric material in the first patterned metal layer and in the second patterned metal layer.

2. The method of claim 1 wherein the IC is a field-programmable gate array.

3. The method of claim 1 wherein the first sacrificial material is a silicate material and the second sacrificial material is the silicate material.

4. The method of claim 3 wherein the step of removing the first sacrificial material and the second sacrificial material comprises a hydrofluoric acid chemical etch.

5. The method of claim 1 wherein the first sacrificial material and the second sacrificial material are removed using a chemical etch.

6. The method of claim 1 wherein the step of removing further removes dielectric material from an inter-layer dielectric ("ILD") layer, and the step of applying further includes permeating the ILD layer with the fluid dielectric material precursor.

7. The method of claim 1 wherein the fluid-based dielectric material comprises polyarylene ether and has a relative dielectric constant less than 4.0.

8. The method of claim 1, wherein forming a first patterned metal layer with a first sacrificial material further comprises forming a dummy metal pad not electrically connected to metal above or below, wherein the etch stop layer supports the dummy metal pad during removal of the first sacrificial material and the second sacrificial material.

9. The method of claim 1, further comprising:
   forming an inter-layer dielectric comprising dielectric material below the first patterned metal layer with the first sacrificial material; and
   forming a intact etch stop layer between the inter-layer dielectric and the first patterned metal layer with the first sacrificial material, wherein the intact etch stop layer prevents removal of the dielectric material in the inter-layer dielectric when removing the first sacrificial material and the second sacrificial material.

10. A method of fabricating an integrated circuit ("IC") comprising:
    providing a partially fabricated wafer;

forming a first patterned metal layer with a first sacrificial material;

forming an etch stop layer entirely atop the first patterned metal layer, with an entirety of the etch stop layer being planar in shape and parallel to the wafer;

forming access holes in the etch stop layer above at least one portion of the first sacrificial material leaving at least a portion of the etch stop layer atop at least another portion of the first sacrificial layer; and then forming a second patterned metal layer with a second sacrificial material atop the etch stop layer;

removing the first sacrificial material and the second sacrificial material so as to form a metal network;

applying fluid dielectric material precursor to the partially fabricated wafer, the fluid dielectric material flowing through the access holes of the etch stop layer so as permeate the metal network; and curing the fluid dielectric material precursor to form fluid-based dielectric material in the first patterned metal layer and in the second patterned metal layer, wherein the step of forming the first patterned metal layer includes forming a dummy metal pad not electrically connected to metal above or below, the etch stop layer supporting the dummy metal pad during the step of removing the first sacrificial material and the second sacrificial material.

* * * * *